United States Patent
Han et al.

(10) Patent No.: US 9,076,701 B2
(45) Date of Patent: Jul. 7, 2015

(54) WAFER SUPPORTING STRUCTURE, INTERMEDIATE STRUCTURE OF A SEMICONDUCTOR PACKAGE INCLUDING THE WAFER SUPPORTING STRUCTURE

(71) Applicant: Samsung Electronics Co., Ltd., Suwon-si (KR)

(72) Inventors: Jun-Won Han, Seoul (KR); Jae-Hyun Kim, Yongin-si (KR); Tae-Hoon Kim, Anyang-si (KR); Ho-Geun Lee, Namyangju-si (KR); You-Jeong Jeong, Seoul (KR); Jung-Sik Choi, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/147,051

(22) Filed: Jan. 3, 2014

(65) Prior Publication Data

US 2014/0183728 A1 Jul. 3, 2014

(30) Foreign Application Priority Data

Jan. 3, 2013 (KR) ........................ 10-2013-0000484

(51) Int. Cl.
| | |
|---|---|
| *H01L 21/58* | (2006.01) |
| *H01L 23/00* | (2006.01) |
| *B32B 7/06* | (2006.01) |
| *H01L 21/683* | (2006.01) |

(52) U.S. Cl.
CPC . *H01L 24/14* (2013.01); *B32B 7/06* (2013.01); *Y10T 428/1476* (2015.01); *Y10T 428/2839* (2015.01); *H01L 21/6835* (2013.01)

(58) Field of Classification Search
CPC ................. H01L 21/6835; H01L 2221/68327; H01L 2221/68381; H01L 2924/35121; H01L 21/67132
USPC .................................................... 257/684, 777
See application file for complete search history.

(56) References Cited

U.S. PATENT DOCUMENTS

| | | | |
|---|---|---|---|
| 6,399,178 B1 * | 6/2002 | Chung .......................... | 428/131 |
| 6,930,023 B2 | 8/2005 | Okada et al. | |
| 7,867,876 B2 | 1/2011 | Codding et al. | |
| 7,883,991 B1 | 2/2011 | Wu et al. | |
| 2005/0147489 A1 | 7/2005 | Chen et al. | |
| 2005/0221598 A1 * | 10/2005 | Lu et al. ........................ | 438/613 |
| 2007/0077728 A1 * | 4/2007 | Kulkarni et al. .............. | 438/455 |
| 2007/0141330 A1 * | 6/2007 | Morishima et al. ........... | 428/343 |
| 2008/0271845 A1 * | 11/2008 | Keite-Telgenbuscher et al. .......................... | 156/307.1 |
| 2010/0043608 A1 * | 2/2010 | Jakob ............................. | 83/13 |
| 2010/0255299 A1 * | 10/2010 | Kawashima et al. ......... | 428/354 |
| 2010/0330788 A1 | 12/2010 | Yu et al. | |
| 2011/0030881 A1 * | 2/2011 | Sasaki et al. .................. | 156/153 |
| 2012/0028438 A1 | 2/2012 | Richter | |
| 2013/0244400 A1 * | 9/2013 | George et al. ................. | 438/458 |
| 2014/0057450 A1 * | 2/2014 | Bourbina et al. ............. | 438/759 |

FOREIGN PATENT DOCUMENTS

| | | |
|---|---|---|
| JP | 2005-129653 | 5/2005 |
| JP | 2005-236112 | 9/2005 |
| JP | 2009-124059 | 6/2009 |
| JP | 2011-171711 | 9/2011 |

* cited by examiner

*Primary Examiner* — George Fourson, III
(74) *Attorney, Agent, or Firm* — Lee & Morse, P.C.

(57) ABSTRACT

A wafer supporting structure includes a supporting substrate for supporting a wafer, a release layer for detaching the wafer from the supporting substrate, and an adhesive layer for attaching the wafer to the supporting substrate.

3 Claims, 11 Drawing Sheets

WAFER SUPPORTING STRUCTURE, INTERMEDIATE STRUCTURE OF A SEMICONDUCTOR PACKAGE INCLUDING THE WAFER SUPPORTING STRUCTURE

CROSS-REFERENCE TO RELATED APPLICATION

Korean Patent Application No. 10-2013-0000484, filed on Jan. 3, 2013, in the Korean Intellectual Property Office, and entitled: "Wafer Supporting Structure, Intermediate Structure of A Semiconductor Package Including the Wafer Supporting Structure and Method of Manufacturing the Semiconductor Package Using the Intermediate Structure," is incorporated by reference herein in its entirety.

BACKGROUND

1. Field

Example embodiments relate to a wafer supporting structure, an intermediate structure of a semiconductor package including the wafer supporting structure, and a method of manufacturing the semiconductor package using the intermediate structure. More particularly, example embodiments relate to a wafer supporting structure used in stacking wafers, an intermediate structure of a semiconductor package including the wafer supporting structure, and a method of manufacturing the semiconductor package using the intermediate structure.

2. Description of the Related Art

Generally, various semiconductor fabrication processes may be formed on a wafer to a plurality of semiconductor chips. In order to mount the semiconductor chips on a printed circuit board (PCB), a packaging process may be performed on the semiconductor chip to form a semiconductor package.

In order to increase storage capacity of the semiconductor package, technologies for stacking the semiconductor packages may be widely developed. The stacked semiconductor packages may be electrically connected with each other through a plug formed in the semiconductor chip. Further, in order to reduce a thickness of the semiconductor package, a lower surface of the wafer may be partially removed to expose the plug.

SUMMARY

Embodiments may be directed to a wafer supporting structure including a supporting substrate for supporting a wafer, a release layer for detaching the wafer from the supporting substrate, and an adhesive layer for attaching the wafer to the supporting substrate.

The release layer may be between the supporting substrate and the adhesive layer.

The adhesive layer may be between the supporting substrate and the release layer.

Embodiments may also be directed to an intermediate structure of a semiconductor package including a wafer including a plurality of semiconductor chips and conductive bumps electrically connected with the semiconductor chips, a first adhesive layer on the wafer, a supporting substrate that supports the wafer, a release layer to detach the wafer from the supporting substrate, and a second adhesive layer attached to the first adhesive layer.

The release layer may be between the supporting substrate and the second adhesive layer.

The release layer may be between the first adhesive layer and the second adhesive layer.

A sum of thicknesses of the first adhesive layer and the second adhesive layer may be greater than a thickness of the conductive bumps.

The first adhesive layer and the second adhesive layer may be configured to fully fill spaces between the conductive bumps.

The wafer may further include plugs built into the wafer and electrically connected to the conductive bumps.

Embodiments may also be directed to a method of manufacturing a semiconductor package including forming a first adhesive layer on a wafer, the wafer including a plurality of first semiconductor chips, first conductive bumps electrically connected with the first semiconductor chips, and plugs electrically connected to the first conductive bumps, forming a release layer and a second adhesive layer on a supporting substrate, attaching the wafer to the supporting substrate using the first adhesive layer and the second adhesive layer, attaching second semiconductor chips to the wafer to electrically connect the plugs of the first semiconductor chips with second conductive bumps of the second semiconductor chips, and detaching the supporting substrate from the wafer along the release layer.

Forming the release layer and the second adhesive layer may include forming the release layer on the supporting substrate, and forming the second adhesive layer on the release layer.

Forming the release layer and the second adhesive layer may include forming the second adhesive layer on the supporting substrate, and forming the release layer on the second adhesive layer.

The method may further include soft-baking the first adhesive layer to anneal the first adhesive layer.

The method may further include soft-baking the release layer to anneal the release layer.

The method may further include soft-baking the second adhesive layer to anneal the second adhesive layer.

Attaching the second semiconductor chips to the wafer may include hard-baking the first and second adhesive layers to anneal the first and second adhesive layers.

The method may further include removing a portion of the wafer to expose the plugs.

Detaching the supporting substrate from the wafer may include fixing edge portions of the wafer, and applying a physical force to the supporting substrate. The physical force may be applied in a vertical direction with respect to the supporting substrate.

The method may further include removing remaining portions of the first and second adhesive layers on the wafer.

The remaining portions of the first and second adhesive layers may be removed using a hydrocarbon-containing solution.

Embodiments may also be directed to a method of manufacturing a semiconductor package including forming a first adhesive layer on a wafer, the wafer including a plurality of first semiconductor chips, first conductive bumps electrically connected with the first semiconductor chips, and plugs electrically connected to the first conductive bumps, soft-baking the first adhesive layer to anneal the first adhesive layer, forming a release layer and a second adhesive layer on a supporting substrate, soft-baking the release layer and the second adhesive layer to anneal the release layer and the second adhesive layer, attaching the wafer to the supporting substrate using the first adhesive layer and the second adhesive layer, hard-baking the first and second adhesive layers to anneal the first and second adhesive layers, attaching second semiconductor chips to the wafer to electrically connect the plugs with second conductive bumps of the second semiconductor chips, and detaching the supporting substrate from the wafer along the release layer.

Forming the release layer and the second adhesive layer may include forming the release layer on the supporting substrate, and forming the second adhesive layer on the release layer.

Forming the release layer and the second adhesive layer may include forming the second adhesive layer on the supporting substrate, and forming the release layer on the second adhesive layer.

The method may include removing a portion of the wafer to expose the plugs.

Detaching the supporting substrate from the wafer may include fixing edge portions of the wafer, and applying a physical force to the supporting substrate.

The physical force may be applied in a vertical direction with respect to the supporting substrate.

The method may further include removing remaining portions of the first and second adhesive layers on the wafer.

Embodiments may also be directed to an intermediate structure of a semiconductor package including a wafer including conductive bumps on one surface thereof, a first adhesive layer directly on the wafer and conformally covering the conductive bumps, a release layer, the release layer having a property of cracking when a physical force is applied to the release layer, a second adhesive layer, and a supporting substrate. One of the second adhesive layer and the release layer may directly contacts the first adhesive layer and fill a space between the conductive bumps to provide a covering structure, and the other of the second adhesive layer and the release layer may directly contact the covering structure and directly contacts the supporting substrate.

The second adhesive layer may directly contact the first adhesive layer and fill a space between the conductive bumps to provide the covering structure. The release layer may directly contact the second adhesive layer and the supporting substrate. A sum of thicknesses of the first adhesive layer and the second adhesive layer may be greater than a thickness in a height direction of the conductive bumps.

The release layer may directly contact the first adhesive layer and fill a space between the conductive bumps to provide the covering structure. The release layer may directly contact the second adhesive layer and the supporting substrate. A sum of thicknesses of the first adhesive layer and the release layer may be greater than a thickness in a height direction of the conductive bumps.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
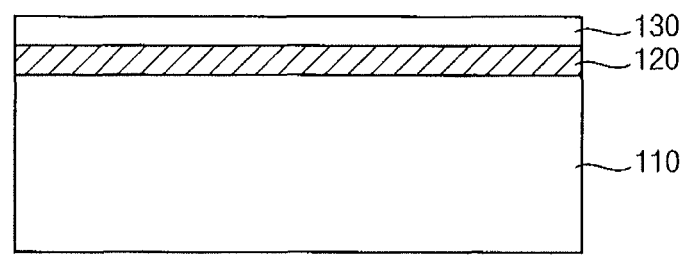
FIG. 1 illustrates a cross-sectional view depicting a wafer supporting structure in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" or "connected to" another layer or substrate, it can be directly on or connected to the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings thereof.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" would then be "upper." The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Wafer Supporting Structure

FIG. 1 illustrates a cross-sectional view depicting a wafer supporting structure in accordance with example embodiments.

Referring to FIG. 1, a wafer supporting structure 100 of this example embodiment may include a supporting substrate 110, a release layer 120, and an adhesive layer 130.

Figure 3:
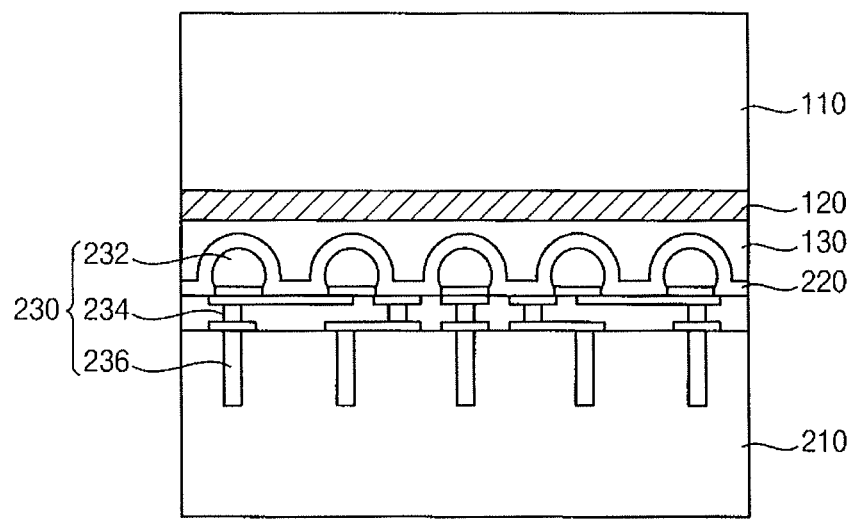
FIG. 3 illustrates a cross-sectional view depicting an intermediate structure of a semiconductor package including the wafer supporting structure in FIG. 1.
Figure 4:
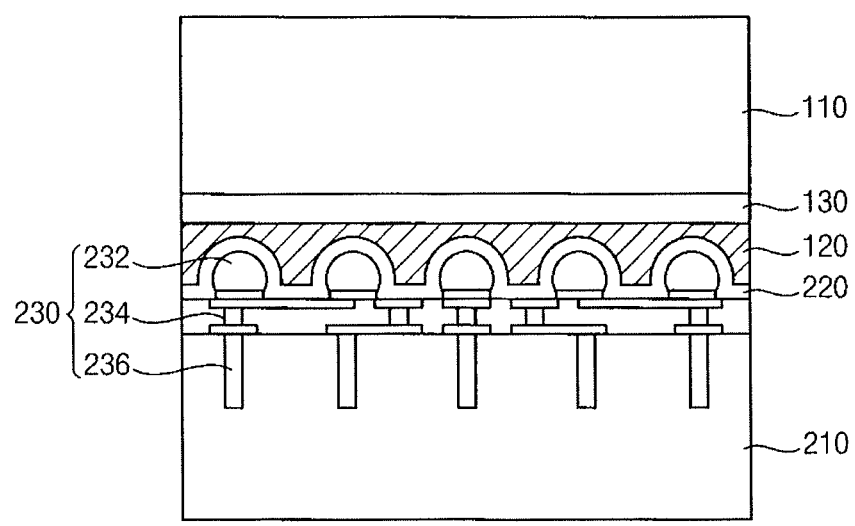
FIG. 4 illustrates a cross-sectional view depicting an intermediate structure of a semiconductor package including the wafer supporting structure in FIG. 2.
Figure 5:
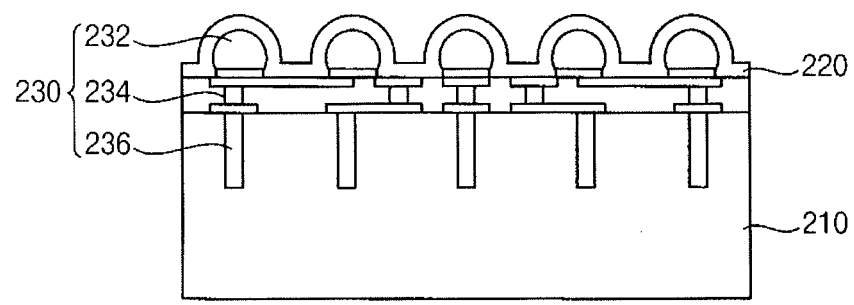
FIGS. 5 to 13 illustrate cross-sectional views depicting stages of a method of manufacturing a semiconductor package using the intermediate structure in FIG. 3.

The supporting substrate 110 may support a wafer in which a plurality of semiconductor chips are formed (see, for example, FIGS. 3-5). In example embodiments, the wafer may include conductive bumps electrically connected with the semiconductor chips, and plugs built in the wafer to be electrically connected to the conductive bumps. The supporting substrate 110 may firmly support the wafer while another wafer including semiconductor chips or other semiconductor chips is stacked on the wafer. The supporting substrate 110 may prevent or reduce the likelihood of warpage of the wafer. In example embodiments, the supporting substrate 110 may include a dummy wafer. In other implementations, the supporting substrate 110 may include an insulating substrate having sufficient strength to support the wafer.

The release layer 120 may be formed on an upper surface of the supporting substrate 110. When the supporting substrate 110 is detached from the wafer after completing the stacking process, cracks may be generated along an interface between the release layer 120 and the adhesive layer 130 to detach the supporting substrate 110 from the wafer.

In example embodiments, the release layer 120 may be positioned on the supporting substrate 110. Thus, the release layer 120 may not directly make contact with the conductive bumps of the wafer. As a result, during detaching of the supporting substrate 110 from the wafer, the cracks may be generated along the release layer 120 spaced apart from the conductive bumps so that damage to the conductive bumps may be suppressed.

The adhesive layer 130 may be formed on an upper surface of the release layer 120. That is, the release layer 120 and the adhesive layer 130 may be sequentially formed on the upper surface of the supporting substrate 110. The adhesive layer 130 may function to attach the supporting substrate 110 to the wafer. The adhesive layer 130 may be attached to another adhesive layer on the wafer.

Figure 2:
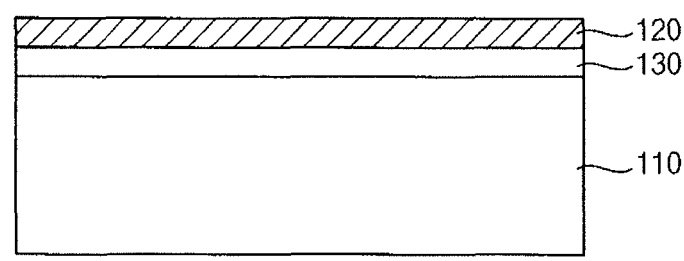
FIG. 2 illustrates a cross-sectional view depicting a wafer supporting structure in accordance with example embodiments.

FIG. 2 illustrates a cross-sectional view depicting a wafer supporting structure in accordance with example embodiments.

A wafer supporting structure 100a of this example embodiment may include elements substantially the same as those of the wafer supporting structure 100 in FIG. 1 except for positions of a release layer and an adhesive layer. Thus, the same reference numerals may refer to the same elements and descriptions of same elements will not be repeated.

Referring to FIG. 2, the adhesive layer 130 may be formed on the upper surface of the supporting substrate 110. The release layer 120 may be formed on an upper surface of the adhesive layer 130. That is, the adhesive layer 130 and the release layer 120 may be sequentially formed on the upper surface of the supporting substrate 110.

Intermediate Structure of a Semiconductor Package

FIG. 3 illustrates a cross-sectional view depicting an intermediate structure of a semiconductor package including the wafer supporting structure in FIG. 1.

Referring to FIG. 3, an intermediate structure 200 of a semiconductor package in accordance with this example embodiment may include a wafer 210, a first adhesive layer 220, a supporting substrate 110, a release layer 120, and a second adhesive layer 130.

In example embodiments, the supporting substrate 110, the release layer 120, and the second adhesive layer 130 may be substantially the same as the supporting substrate 110, the release layer 120, and the adhesive layer 130 in FIG. 1, respectively. Thus, descriptions of same aspects of the supporting substrate 110, the release layer, and the second adhesive layer 130 will not be repeated.

The wafer 210 may be arranged under the supporting substrate 110. The release layer 120 and the second adhesive layer 130 may be sequentially formed on the lower surface of the supporting substrate 110. That is, the wafer supporting substrate 100 in FIG. 1, flipped over by an angle of about 180°, may be arranged over the wafer 210.

In example embodiments, the wafer 210 may include a plurality of semiconductor chips 230. Each of the semiconductor chips 230 may include conductive bumps 232, connecting terminals 234, and plugs 236. The conductive bumps may be formed on an upper surface of the semiconductor chip 230 to electrically connect the connecting terminals 234 with bonding pads of the semiconductor chip 230. The plugs 236 may be built into the semiconductor chip 230, i.e., the wafer 210, to electrically connect the connecting terminals 234 with the conductive bumps 232.

In example embodiments, each of the plugs 236 may have an upper end connected to the conductive bump 232 and a lower end extended toward the lower surface of the wafer 210. The lower end of the plug 236 may not be exposed through the lower surface of the wafer 210. In other implementations, the lower end of the plug 236 may be exposed through the lower surface of the wafer 210.

The first adhesive layer 220 may be formed on the upper surface of the wafer 210. The first adhesive layer 220 may face the second adhesive layer 130. The first adhesive layer 220 may be directly attached to the second adhesive layer 130. The supporting substrate 110 may be firmly fixed to the upper surface of the wafer 210 by attaching the first adhesive layer 220 and the second adhesive layer 130 to each other.

In example embodiments, a sum of thicknesses of the first adhesive layer 220 and the second adhesive layer 130 may be greater than a thickness of the conductive bumps 232. Thus, the attached first and second adhesive layers 220 and 130 may be configured to fully cover the conductive bumps 232. Further, the attached first adhesive layer 220 and second adhesive layer 130 may be configured to fully fill spaces between the conductive bumps 232. As a result, the attached first and second adhesive layers 220 and 130 may firmly support the conductive bumps 232 so that a collapse of the conductive bumps 232 may be prevented or hindered. Accordingly, electrical short between the conductive bumps 232 may also be prevented or hindered. Further, the attached first and second adhesive layers 220 and 130 may also function to suppress a thickness change of the semiconductor package during a following stacking process.

According to this example embodiment, the release layer 120 may be provided to the supporting substrate 110, and not to the wafer 210, so that the release layer 120 does not directly contact the conductive bump 232. Cracks that may be generated along the interface between the release layer 120 and the second adhesive layer 130 during detaching the supporting substrate 110 from the wafer 210 may have no influence on the conductive bump 232. As a result, damage to the conductive bumps 232 during the detaching process may be suppressed.

FIG. 4 illustrates a cross-sectional view depicting an intermediate structure of a semiconductor package including the wafer supporting structure in FIG. 2.

An intermediate structure 200a of a semiconductor package in accordance with this example embodiment may include elements substantially the same as those of the intermediate structure 200 in FIG. 3 except for including the wafer supporting structure 100a in FIG. 2 in place of the wafer supporting structure 100 in FIG. 1. Thus, the same reference numerals may refer to the same elements and descriptions of same elements will not be repeated.

Referring to FIG. 4, the release layer 120 may be interposed between the first adhesive layer 220 and the second adhesive layer 130. Thus, cracks may be generated along interfaces between the first adhesive layer 220 and the release layer 120, and between the second adhesive layer 120 and the release layer 120 during the detaching process.

According to this example embodiment, the release layer 120 may be arranged between the first adhesive layer 220 and the second adhesive layer 130 so that the release layer 120 may be positioned relatively closer to the wafer 210 compared to the intermediate structure 200 in FIG. 3. However, similar to the intermediate structure 200 illustrated in FIG. 3 the release layer 120 does not directly contact the conductive bumps 232. Damage to the conductive bumps 232 during the detaching process may thereby be suppressed.

Method of Manufacturing a Semiconductor Package

FIGS. 5 to 13 illustrate cross-sectional views depicting stages of a method of manufacturing a semiconductor package using the intermediate structure in FIG. 3.

Referring to FIG. 5, the first adhesive layer 220 may be formed on the upper surface of the wafer 210. The first adhesive layer 220 may be soft-baked to anneal the first adhesive layer 220.

In example embodiments, the wafer 210 may include a plurality of first semiconductor chips 230. Each of the first semiconductor chips 230 may include first conductive bumps 232, connecting terminals 234, and plugs 236. The first conductive bumps 232 may be formed on an upper surface of the semiconductor chip 230 to electrically connect the connecting terminals 234 with bonding pads of the first semiconductor chip 230. The plugs 236 may be built into the semiconductor chip 230, i.e., the wafer 210, to electrically connect the connecting terminals 234 with the first conductive bumps 232. Each of the plugs 236 may have an upper end connected to the first conductive bump 232 and a lower end extended toward the lower surface of the wafer 210. The lower end of the plug 236 may not be exposed through the lower surface of the wafer 210.

The first adhesive layer 220 may be formed on the upper surface of the first semiconductor chip 230 and surfaces of the first conductive bumps 232. The first adhesive layer 220 may have a strength that is stronger than that of the release layer 120. The first adhesive layer 220 may firmly support the first conductive bumps 232. As a result, an electrical short between the first conductive bumps 232 that could be caused by a collapse of the first conductive bumps 232 may be suppressed during following processes.

Figure 6:
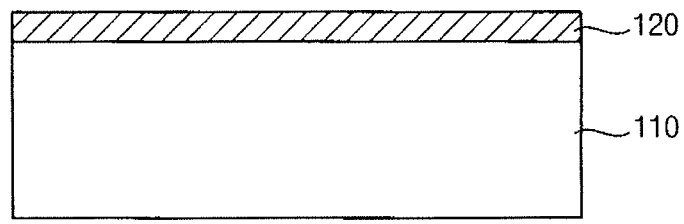

Referring to FIG. 6, the release layer 120 may be formed on the upper surface of the supporting substrate 110. The release layer 120 may be soft-baked to anneal the release layer 120.

Figure 7:
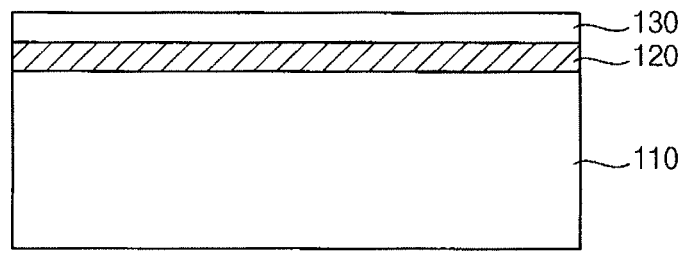

Referring to FIG. 7, the second adhesive layer 130 may be formed on the upper surface of the release layer 120. The second adhesive layer 130 may be soft-baked to anneal the second adhesive layer 130.

Figure 8:
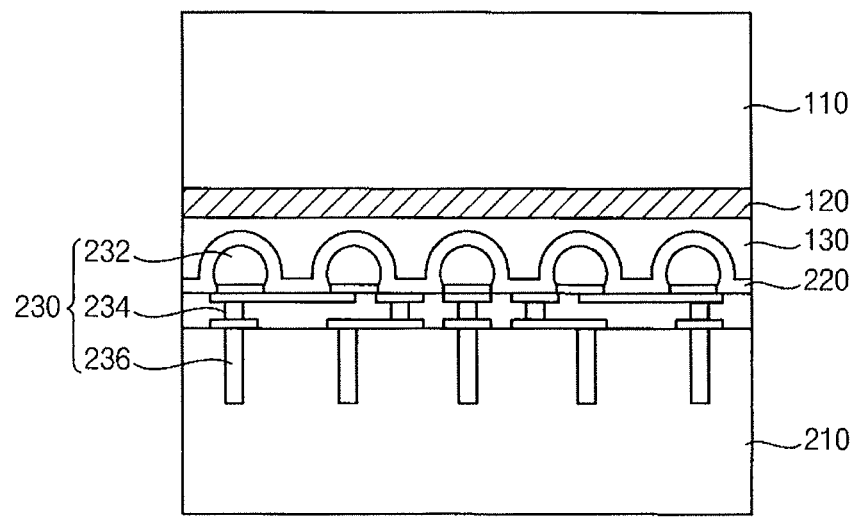

Referring to FIG. 8, the supporting substrate 110 may be flipped over by an angle of about 180°. The reversed supporting substrate 110 may be arranged over the wafer 210. Thus, the first adhesive layer 220 may face the second adhesive layer 130.

The supporting substrate 110 may be attached to the wafer 210 using the first adhesive layer 220 and the second adhesive layer 130 to complete the intermediate structure 200 in FIG. 3.

In example embodiments, a sum of thicknesses of the first adhesive layer 220 and the second adhesive layer 130 may be greater than a thickness of the conductive bumps 232. The attached first and second adhesive layers 220 and 130 may be configured to fully cover the conductive bumps 232. Further, the attached first adhesive layer 220 and second adhesive layer 130 may be configured to fully fill spaces between the conductive bumps 232. As a result, the attached first adhesive layer 220 and second adhesive layer 130 may firmly support the conductive bumps 232 so that collapses of the conductive bumps 232 may be prevented or hindered. Therefore, an electrical short between the conductive bumps 232 may also be prevented or hindered. Further, the attached first adhesive layer 220 and second adhesive layer 130 may also function to suppress a thickness change of the semiconductor package during a following stacking process.

Figure 9:
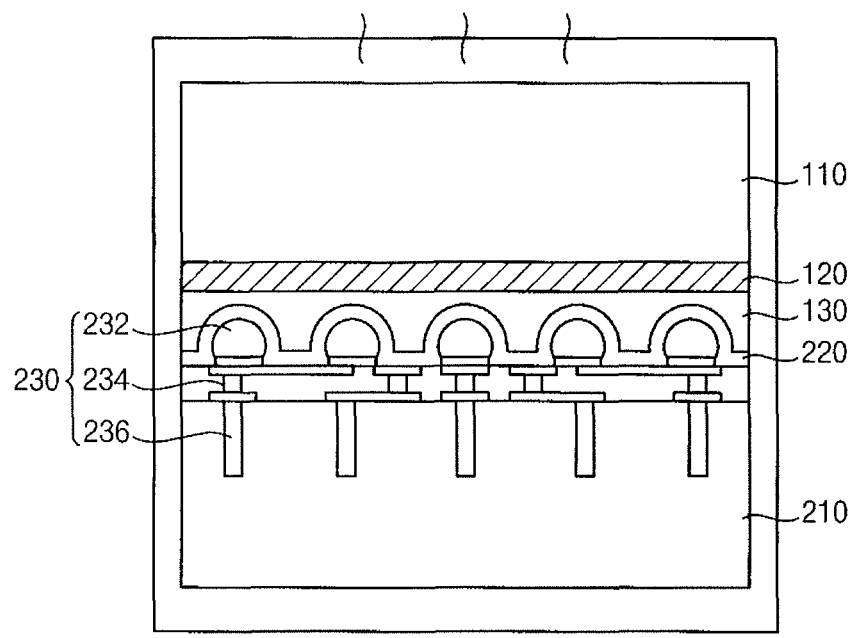

Referring to FIG. 9, the wafer 210 attached to the supporting substrate 110 may be hard-baked to anneal the attached first and second adhesive layers 220 and 130. The supporting substrate 110 and the wafer may be firmly fixed to each other by annealing the attached first adhesive layer 220 and second adhesive layer 130.

Figure 10:
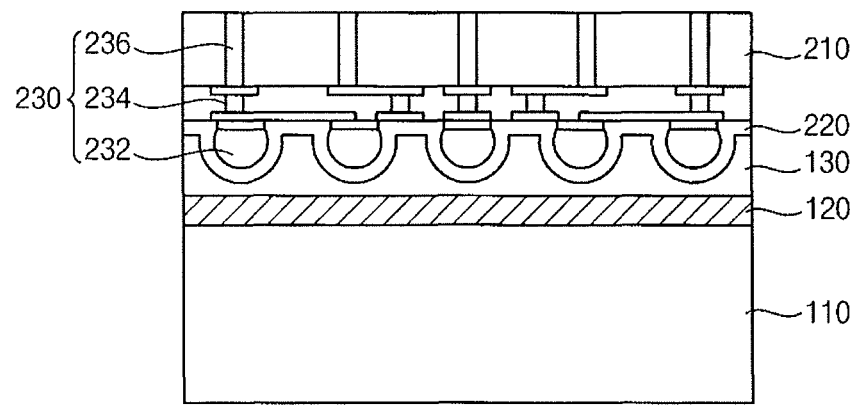

Referring to FIG. 10, the supporting substrate 110 and the wafer 210 may be flipped over by an angle of about 180° such that the wafer 210 is positioned over the supporting substrate 110 and the lower surface of the wafer 210 is exposed upwardly.

The lower surface of the wafer 210 may be partially removed to expose the lower ends of the plugs 236. In example embodiments, the lower surface of the wafer 210 may be removed by a grinding process. In other implementations, the lower ends of the plugs 236 may be formed to be exposed through the lower surface of the wafer 210, and the grinding process may be omitted.

Figure 11:
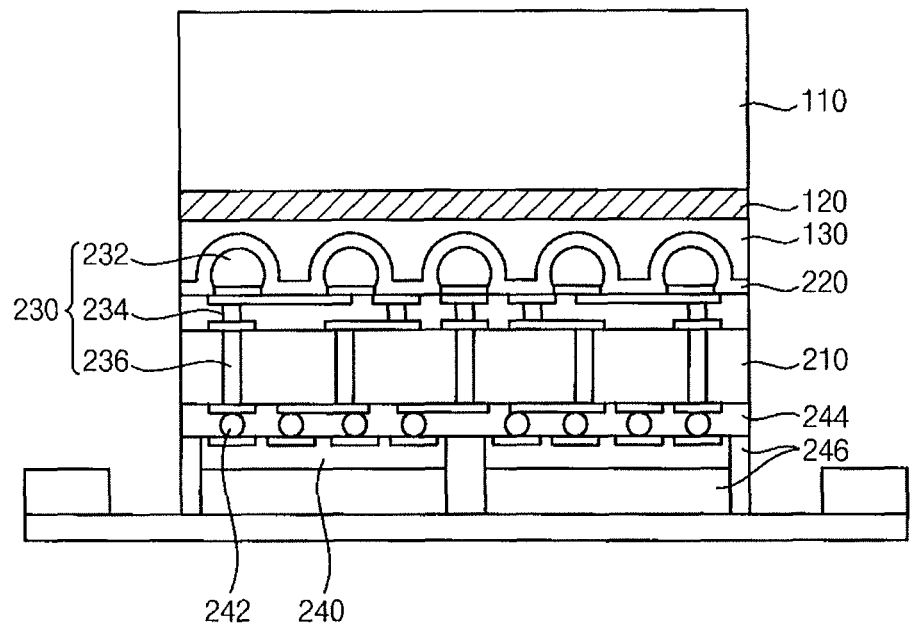

Referring to FIG. 11, second semiconductor chips 240 may be stacked on the lower surface of the wafer 210. For example, after the grinding process, bonding pads may be formed on the exposed lower ends of the plugs 236. The supporting substrate 110 and the wafer 120 may be flipped back over to the orientation illustrated in FIG. 9. Thus, the wafer 210 and the second semiconductor chips 240 may be positioned under the supporting substrate 110. In example embodiments, each of the second semiconductor chips 240 may include second conductive bumps 242. The second conductive bumps 242 may be electrically connected with bonding pads of the second semiconductor chip 240. Heat and pressure may be applied to the wafer 210 and the second semiconductor chips 240 under vacuum to attach the second conductive bumps 242 to the exposed lower ends of the plugs 236.

In other implementations, a second wafer including the second semiconductor chips 240 may be attached to the wafer 210.

An underfilling layer 244 may be formed between the first semiconductor chips 230 and the second semiconductor chips 240. Thus, the second conductive bumps 242 may be surrounded by the underfilling layer 244. A molding member 246 may be formed on side surfaces and a lower surface of the second semiconductor chip 240.

Figure 12:
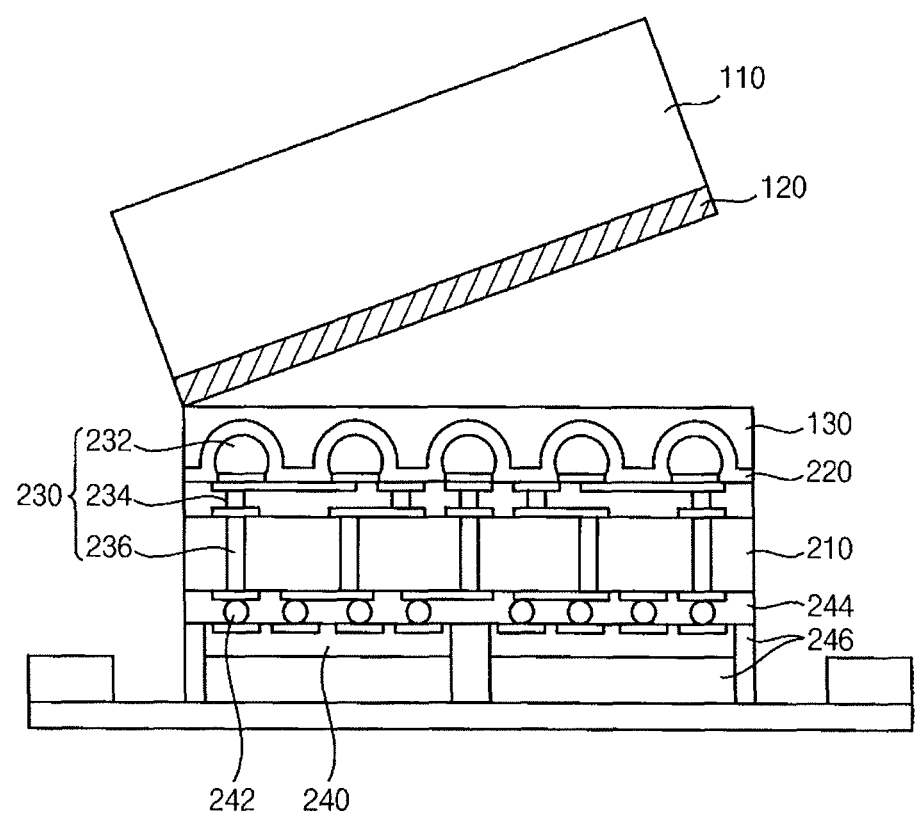

Referring to FIG. 12, the supporting substrate 110 may be detached from the wafer 210. In example embodiments, edge portions of the wafer 210 may be fixed. A physical force may be applied to the supporting substrate 110 in a vertical direction. Cracks may be generated in the attached first and second adhesive layers 220 and 130. The cracks may progress along the inside of the release layer 120 and the interface between the release layer 120 and the second adhesive layer 130 so that the supporting substrate 110 may be separated from the wafer 210. The cracks may progress along the release layer 120. The release layer 120 may be spaced apart from the first conductive bumps 236. Accordingly, the cracks may not be transmitted to the first conductive bumps 236. As a result, damage to the first conductive bumps 236 may be suppressed during the detaching process.

Figure 13:
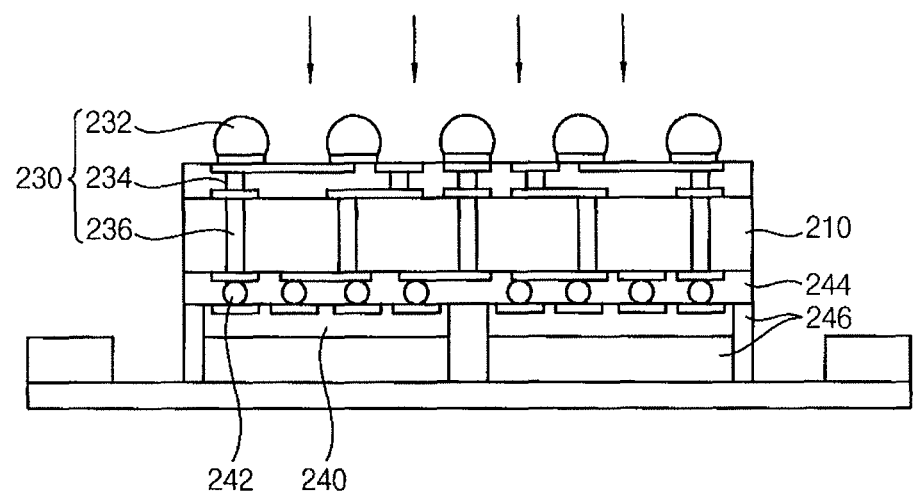

Referring to FIG. 13, a removing solution may be applied to the wafer 210 to remove remaining portions of the second adhesive layer 130. In example embodiments, the removing solution may include a hydrocarbon-containing solution.

The wafer 210 may be cut along a scribe lane to complete the semiconductor package including the first semiconductor chip 230 and the second semiconductor chip 240 sequentially stacked.

FIGS. 14 to 22 illustrate cross-sectional views depicting stages of a method of manufacturing a semiconductor package using the intermediate structure in FIG. 4.

Figure 14:
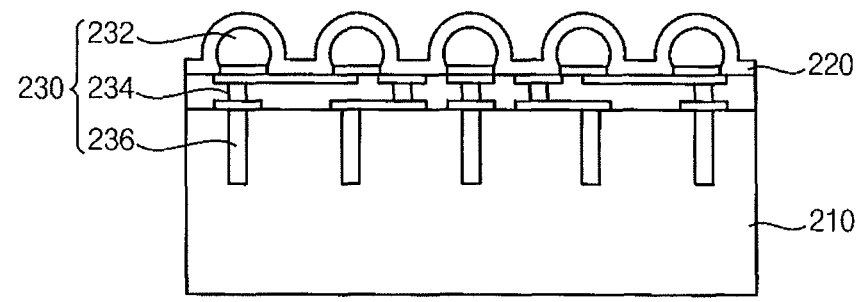
FIGS. 14 to 22 illustrate cross-sectional views depicting stages of a method of manufacturing a semiconductor package using the intermediate structure in FIG. 4.

Referring to FIG. 14, the first adhesive layer 220 may be formed on the upper surface of the wafer 210. The first adhesive layer 220 may be soft-baked to anneal the first adhesive layer 220.

Figure 15:
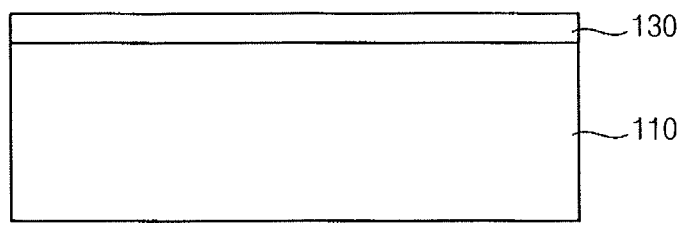

Referring to FIG. 15, the second adhesive layer 130 may be formed on the upper surface of the supporting substrate 110. The second adhesive layer 130 may be soft-baked to anneal the second adhesive layer 130.

Figure 16:
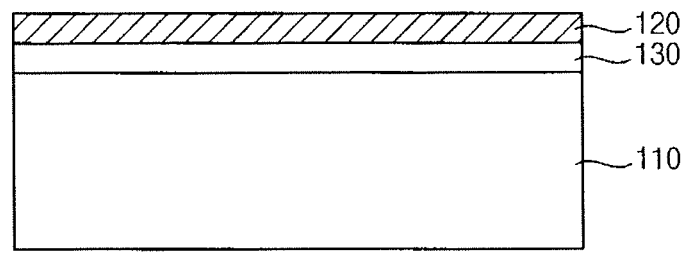

Referring to FIG. 16, the release layer 120 may be formed on the upper surface of the second adhesive layer 130. The release layer 120 may be soft-baked to anneal the release layer 120.

Figure 17:
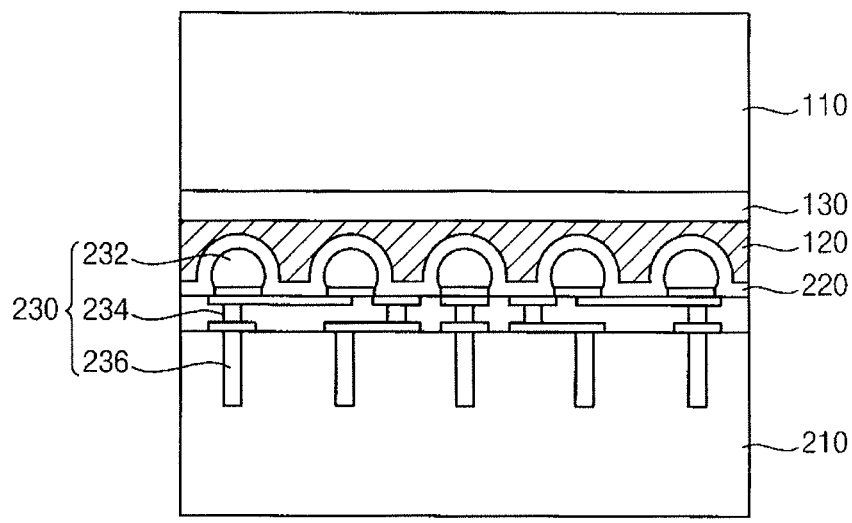

Referring to FIG. 17, the supporting substrate 110 may be flipped over by an angle of about 180° such that the release layer faces the wafer 210. The supporting substrate 110 may then be arranged over the wafer 210. The release layer 120 may be positioned between the first adhesive layer 220 and the second adhesive layer 130.

The supporting substrate 110 may be attached to the wafer 210 using the first adhesive layer 220 and the second adhesive layer 130 to complete the intermediate structure 200a illustrated in FIG. 4.

Figure 18:
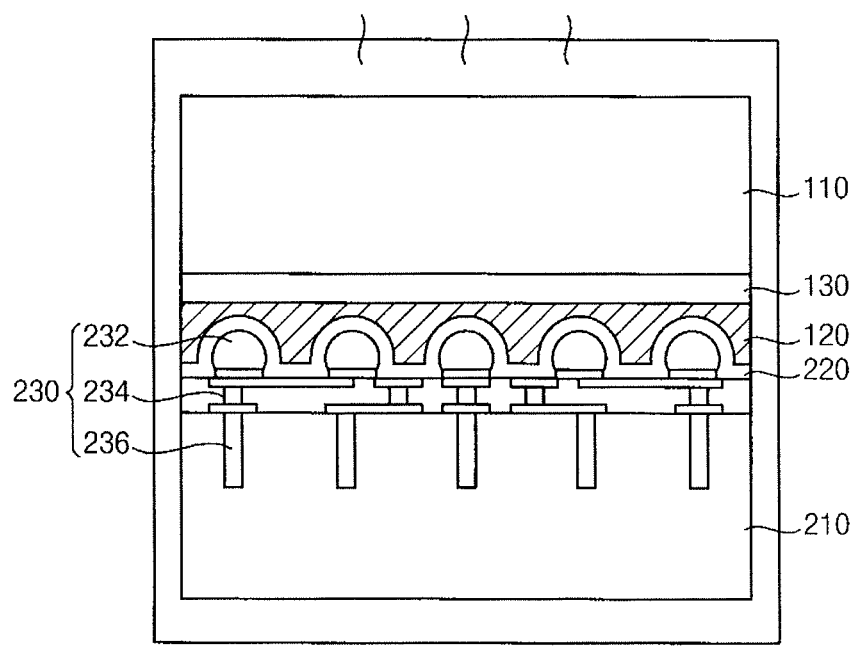

Referring to FIG. 18, the wafer 210 attached to the supporting substrate 110 may be hard-baked to anneal the attached first and second adhesive layers 220 and 130 via the release layer 120. The supporting substrate 110 and the wafer may be firmly fixed to each other by annealing the attached first and second adhesive layers 220 and 130.

Figure 19:
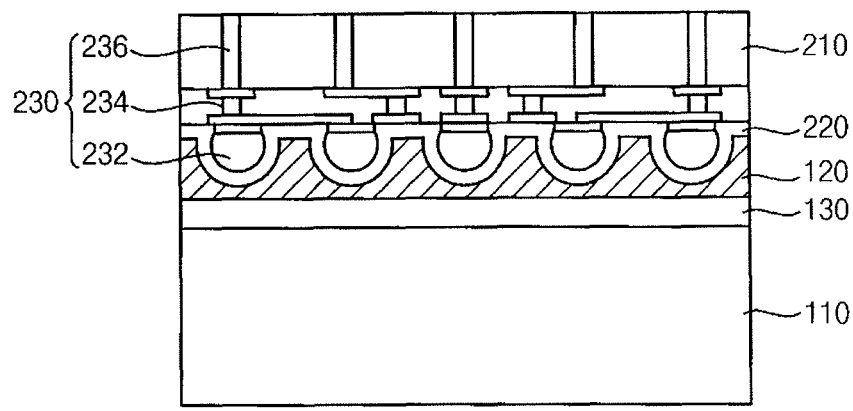

Referring to FIG. 19, the supporting substrate 110 and the wafer 210 may be flipped over by an angle of about 180°. Thus, the wafer 210 may be positioned over the supporting substrate 110 so that the lower surface of the wafer 210 is exposed upwardly.

The lower surface of the wafer 210 may be partially removed to expose the lower ends of the plugs 236. In example embodiments, the lower surface of the wafer 210 may be removed by a grinding process. In other implementations, when the lower ends of the plugs 236 may be formed to be exposed through the lower surface of the wafer 210, and the grinding process may be omitted.

Figure 20:
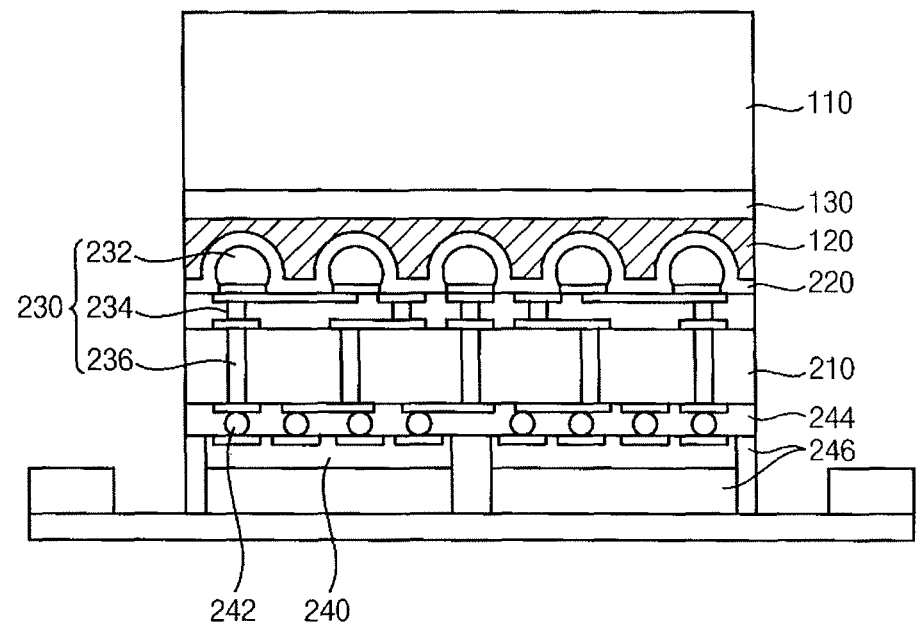

Referring to FIG. 20, second semiconductor chips 240 may be stacked on the lower surface of the wafer 210. For example, after the grinding process, bonding pads may be formed on the exposed lower ends of the plugs 236. The supporting substrate 110 and the wafer 120 may be flipped back over to the orientation illustrated in FIGS. 17-18 such that the wafer 210 and the second semiconductor chips 240 is positioned under the supporting substrate 110. In example embodiments, each of the second semiconductor chips 240 may include second conductive bumps 242. The second conductive bumps 242 may be electrically connected with bonding pads of the second semiconductor chip 240. Heat and pressure may be applied to the wafer 210 and the second semiconductor chips 240 under vacuum to attach the second conductive bumps 242 to the exposed lower ends of the plugs 236.

In other implementations, a second wafer including the second semiconductor chips 240 may be attached to the wafer 210.

An underfilling layer 244 may be formed between the first semiconductor chips 230 and the second semiconductor chips 240. Thus, the second conductive bumps 242 may be surrounded by the underfilling layer 244. A molding member 246 may be formed on side surfaces and a lower surface of the second semiconductor chip 240.

Figure 21:
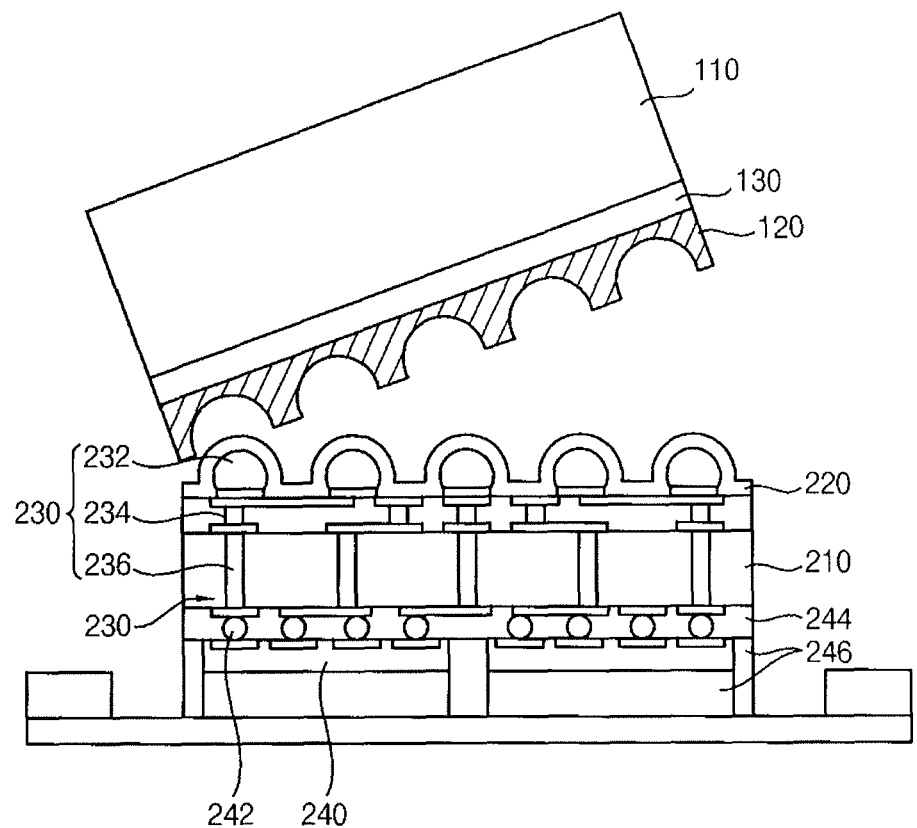

Referring to FIG. 21, the supporting substrate 110 may be detached from the wafer 210. In example embodiments, edge portions of the wafer 210 may be fixed. A physical force may be applied to the supporting substrate 110 in a vertical direction. Cracks may be generated in the attached first and second adhesive layers 220 and 130. The cracks may progress along the interface between the release layer 120 and the first adhesive layer 220, along the inside of the release layer 120, and along the interface between the release layer 120 and the second adhesive layer 130 such that the supporting substrate 110 may be separated from the wafer 210. The cracks may progress along the release layer 120. The release layer 120 may be spaced apart from the first conductive bumps 236. Accordingly, the cracks may not be transmitted to the first conductive bumps 236. As a result, damage to the first conductive bumps 236 may be suppressed during the detaching process.

Figure 22:
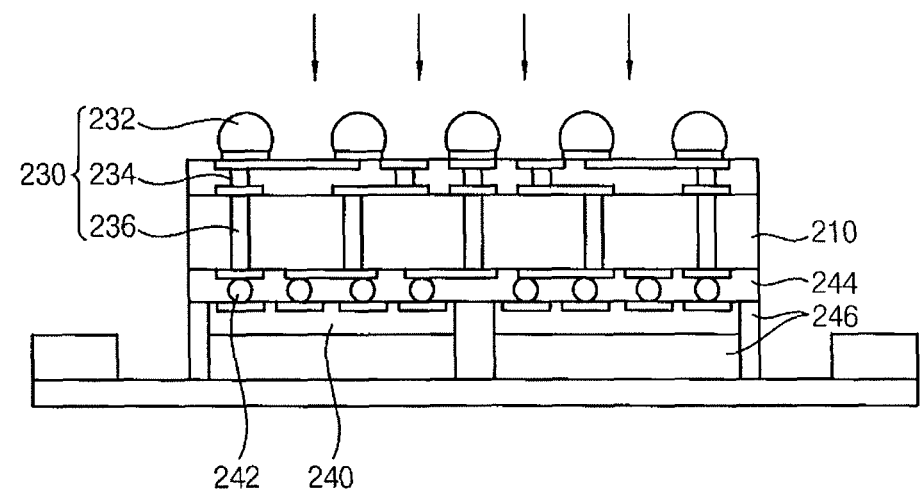

Referring to FIG. 22, a removing solution may be applied to the wafer 210 to remove remaining portions of the second adhesive layer 130. In example embodiments, the removing solution may include a hydrocarbon-containing solution.

The wafer 210 may be cut along a scribe lane to complete the semiconductor package including the first semiconductor chip 230 and the second semiconductor chip 240 sequentially stacked.

By way of summation and review, when a stacking process is performed on a very thin wafer, the wafer may be warped. In order to prevent the warpage of the wafer, the wafer may be attached to a wafer supporting structure such as a carrier wafer using an adhesive layer and a release layer. The stacking process may be performed on the wafer attached to the carrier wafer. After performing the stacking process, the wafer supporting structure may be detached from the wafer along the release layer. For example, the release layer may be formed directly on the wafer. Thus, during the detaching of the wafer supporting structure, conductive bumps on the wafer may collapse. The collapsed conductive bumps may become electrically connected with each other to generate electrical shorts between the conductive bumps.

A plasma separating layer may be used for detaching a wafer supporting structure from a wafer. However, a structure of the plasma separating layer may vary in accordance with a structure of the conductive bumps so that detachment failures may be frequently generated in the detaching process.

Embodiments provide a wafer supporting structure that may be capable of preventing failures resulting from a detachment process between a wafer and the wafer supporting structure.

Example embodiments also provide an intermediate structure of a semiconductor package including the above-mentioned wafer supporting structure.

Example embodiments also provide a method of manufacturing the semiconductor package using the above-mentioned intermediate structure.

According to example embodiments, the release layer may be provided to the supporting substrate far away from the conductive bumps so that damages of the conductive bumps may be suppressed during detaching the supporting substrate from the wafer. Further, the supporting substrate may be readily detached from the wafer by only applying physical force to the supporting substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An intermediate structure of a semiconductor package, the intermediate structure comprising:
   a wafer including conductive bumps on one surface thereof;
   a first adhesive layer directly on the wafer and conformally covering the conductive bumps;
   a release layer, the release layer having a property of cracking when a physical force is applied to the release layer;
   a second adhesive layer; and
   a supporting substrate,
   wherein one of the second adhesive layer and the release layer directly contacts the first adhesive layer and fills a space between the conductive bumps to provide a covering structure, and the other of the second adhesive layer and the release layer directly contacts the covering structure and directly contacts the supporting substrate.

2. The intermediate structure as claimed in claim 1, wherein:
   the second adhesive layer directly contacts the first adhesive layer and fills a space between the conductive bumps to provide the covering structure, and the release layer directly contacts the second adhesive layer and the supporting substrate, and
   a sum of thicknesses of the first adhesive layer and the second adhesive layer is greater than a thickness in a height direction of the conductive bumps.

3. The intermediate structure as claimed in claim 1, wherein:
   the release layer directly contacts the first adhesive layer and fills a space between the conductive bumps to provide the covering structure, and the release layer directly contacts the second adhesive layer and the supporting substrate, and
   a sum of thicknesses of the first adhesive layer and the release layer is greater than a thickness in a height direction of the conductive bumps.

* * * * *